(12) United States Patent
Tachigori

(10) Patent No.: US 6,329,881 B1
(45) Date of Patent: Dec. 11, 2001

(54) PREAMPLIFIER

(75) Inventor: Masashi Tachigori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/694,305

(22) Filed: Oct. 24, 2000

(30) Foreign Application Priority Data

Oct. 25, 1999 (JP) .................................................. 11-303170

(51) Int. Cl.[7] ...................................................... H03F 3/08
(52) U.S. Cl. ....................... 330/308; 330/110; 250/214 A
(58) Field of Search .................................. 330/110, 308; 250/214 A

(56) References Cited

U.S. PATENT DOCUMENTS 5,030,925 * 7/1991 Taylor .................................... 330/308
5,844,445 * 12/1998 Takeyari ................................. 330/293
6,084,232 * 7/2000 Kimura ............................. 250/214 A

FOREIGN PATENT DOCUMENTS 4-306904   10/1992   (JP) .
4-306905   10/1992   (JP) .

* cited by examiner

*Primary Examiner*—Robert Pascal
*Assistant Examiner*—Henry Choe
(74) *Attorney, Agent, or Firm*—McGinn & Gibb, PLLC

(57) ABSTRACT

A preamplifier is provided with a current feedback circuit including an amplifier for amplifying an input optical current and a feedback resistor connected between an input and an output of the amplifier, an average detecting circuit for detecting an average output voltage of the current feedback circuit and a current controlling circuit for distributing the input optical current in accordance with the detected average voltage. With this configuration, it is possible to generate an output voltage keeping an amplitude symmetry in a large voltage range.

15 Claims, 15 Drawing Sheets current of photodiode
and feedback register RF output voltage current of photodiode current of current controlling circuit current of Rf output voltage current of photodiode output voltage voltage of both ends of RF potential difference of both ends of RF
after over-current bypass by diode potential difference of both ends
of feedback register RF
after by passing over-current

PREAMPLIFIER

BACKGROUND OF THE INVENTION

1. Field of the Invention

The present invention relates to a photo receiver used in an optical transmission system and more particularly to a preamplifier capable of preventing an output waveform from distorting when a large light is input.

The present application claims the priority of Japanese Patent Application No. Hei11-303170 filed on Oct. 25, 1999, which is hereby incorporated by reference.

2. Description of the Related Art

In an optical transmission system, in order to convert a received input light into a signal voltage and in order to output the signal voltage, a circuit is generally used in which the received input light is converted into a current via a photodiode and then is amplified by a preamplifier so that a required signal voltage output is obtained.

A conventional preamplifier used for this purpose is disclosed in Japanese Patent Application Laid-open No. Hei 4-306904.

In the conventional preamplifier, as shown in FIG. 16, a photodiode 104 is connected between an input terminal 102 and a bias source $V_H$ of a differential amplifier 101, a reference voltage $V_{ref}$ is connected to a reference input terminal 107, a feedback resistor $R_f$ is connected between an inverting output terminal 103 and the input terminal 102, an FET (Field Effect Transistor) Q100 is connected in parallel with the feedback resistor $R_f$, a level converting circuit 106 is connected to a positive phase output terminal 105 and an output of the level converting circuit 106 is connected to a gate of the FET Q100.

In operation of the conventional preamplifier, when an input light is received, an optical current $I_{ph}$ flows into the input terminal 102 via the photodiode 104. With this operation, an output voltage $V_{out}$ occurs at the inverting output terminal 103. At this time, feedback is applied via the feedback resistor $R_f$, and thereby a constant amplifying gain can be obtained. When the input light level is excessive, an output occurs from the level converting circuit 106 caused by the output voltage from the positive phase output terminal 105, therefore, the FET Q100 becomes conductive and a feedback resistance value becomes small. As a result, the amplifying gain lowers and the output voltage $V_{out}$ is prevented from increasing, therefore, the differential amplifier 101 is prevented from saturating.

Also, there is disclosed an another conventional preamplifier used for the above-mentioned purpose is disclosed in Japanese Patent Application Laid-open No. Hei 4-306905.

In the another conventional preamplifier, as shown in FIG. 17, a photodiode 104 is connected between an input terminal 102 and a bias source $V_H$ of a differential amplifier 101, a reference voltage $V_{ref}$ is connected to a reference input terminal 107, a feedback resistor $R_f$ is connected between an inverting output terminal 103 and the input terminal 102, an FET (Field Effect Transistor) Q101 is connected between the input terminal 102 and a ground potential $V_{BB}$, a level converting circuit 106 is connected to a positive phase output terminal 105 and an output of the level converting circuit 106 is connected to a gate of the FET Q101.

In operation of the another conventional preamplifier, when an input light is received, an optical current $I_{ph}$ flows into the input terminal 102 via the photodiode 104. With this operation, an output voltage $V_{out}$ occurs at the inverting output terminal 103. At the time, a feedback is applied via the feedback resistor $R_f$, and thereby a constant amplifying gain can be obtained. When the input light level is excessive, an output occurs from the level converting circuit 106 caused by the output voltage from the positive phase output terminal 105, therefore, the FET Q101 becomes conductive and the optical current $I_{ph}$ is distributed to the ground potential $V_{BB}$. As a result, amplifying gain lowers and the output voltage $V_{out}$ is prevented from increasing, therefore, the differential amplifier 101 is prevented from saturating.

With the conventional preamplifiers shown in FIG. 16 and FIG. 17, when the input light exceeds a predetermined level, the output voltage $V_{out}$ is prevented from increasing, therefore, the differential amplifier 101 can be prevented from saturating.

However, at this time, since the level converting circuit 106 detects increment in a polarity direction of a positive phase output voltage and then generates an output, one side of a waveform of the output voltage $V_{out}$ is clipped in accordance with an operation of the FET Q100 or the FET Q101.

FIG. 18 shows an example of the output voltage when an input current is bypassed in the conventional preamplifiers shown in FIG. 16 and FIG. 17.

In FIG. 18, a |voltage| designates a potential difference of both ends of the feedback resistor $R_f$ after bypassing an over-current, a $V_0$ designates a voltage when an optical current $I_{ph}$ is minimum, an $I_{ph}XR_f$ designated by a dotted line designates a voltage when the optical current $I_{ph}$ is maximum and the differential amplifier 101 is not saturated. Actually, when the optical current $I_{ph}$ is large, the output voltage is limited in accordance with the operation of the FET Q100 or the Q101. As a result, therefore, the |voltage| varies asymmetrically up and down as designated by a solid line.

As above described, in the conventional preamplifier circuit, there is a problem in that an output waveform is distorted when the optical input level is excessive.

SUMMARY OF THE INVENTION

In view of the above, it is an object of the present invention to provide a preamplifier capable of preventing an output waveform from distorting though an optical input level of an optical receiver is large.

According to a first aspect of the present invention, there is provided a preamplifier including:

a current feedback circuit including an amplifier for amplifying an input optical current and a feedback resistor connected between an input and an output of the amplifier;

an average detecting circuit for detecting an average of an output voltage of the current feedback circuit; and a current controlling circuit for distributing the input optical current in accordance with a detected average of the output voltage.

In the foregoing, a preferable mode is one wherein the current feedback circuit includes a grounded-emitter transistor amplifier for amplifying the input optical current, an emitter follower transistor amplifier for amplifying an output from the grounded-emitter transistor amplifier and a feedback resistor connecting an output of the emitter follower transistor amplifier with an input of the grounded-emitter transistor amplifier.

Also, a preferable mode is one wherein a bypass circuit for clipping a voltage more than a predetermined threshold bi-directionally is connected in parallel with the feedback resistor of the current feedback circuit.

Also, a preferable mode is one wherein the bypass circuit includes two diodes connected in parallel in an opposite direction to each other.

Also, a preferable mode is one wherein the current controlling circuit is a current mirror circuit for distributing the input optical current in accordance with the output voltage of the average detecting circuit.

Also, a preferable mode is one wherein the average detecting circuit includes an integrating circuit for smoothing the output voltage of the current feedback circuit and an emitter follower circuit for amplifying the output voltage smoothed by the integrating circuit.

Also, a preferable mode is one wherein a comparing circuit is provided at an output of the average detecting circuit and outputs an average voltage exceeding a reference voltage.

Furthermore, a preferable mode is one wherein the reference voltage is generated by a non-input current feedback circuit having a same configuration of the current feedback circuit.

With the above configurations, the preamplifier includes a current feedback circuit for amplifying an input optical current, an average detecting circuit for detecting an average voltage of an output from the current feedback circuit and a current controlling circuit for distributing the input optical current in accordance with the detected average voltage, therefore, a current flowing into the feedback resistor becomes one-half. As a result, there is no case in that the output voltage becomes asymmetric as long as the input optical current becomes twice.

Also, the bypass circuit for bi-directionally clipping the voltage more than a predetermined threshold is connected in parallel to the feedback resistor of the current feedback circuit, therefore, it is possible to limit up and down symmetrically the output voltage of the preamplifier to a fixed voltage in accordance with the predetermined threshold of the bypass circuit without a waveform distortion regardless of a large input.

Also, the comparing circuit is provided for the output of the average detecting circuit and the average voltage exceeding the reference voltage is output, therefore, it is possible not to vary the output voltage when no light is input and it is possible to set a limit value of the output voltage of the preamplifier accurately.

Also, the reference voltage is generated by the non-input current feedback circuit of which configuration is similar to that of the current feedback circuit of the preamplifier, therefore, it is possible to stably supply the reference voltage setting the current distributed to the current controlling circuit to 0 (zero). As a result, it is possible to set the limit value of the output voltage of the preamplifier accurately.

Furthermore, in the current feedback circuit for amplifying the input optical current, the average of the output voltage is detected and the input optical current is distributed in accordance with the average voltage, therefore, it is possible to generate the output voltage keeping the amplitude symmetry in the large voltage range. Also, the bypass circuit for clipping the voltage more than the threshold bi-directionally to the feedback resistor of the current feedback circuit, therefore, it is possible to obtain the output voltage of the fixed amplitude regardless of the amount of the input optical current. Furthermore, the average current of the optical current is distributed by the average voltage exceeding the reference voltage, therefore, it is possible to eliminate influence of a variation of the output voltage when no light is input and it is possible to set the limit value of the output voltage of the preamplifier accurately.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes for carrying out the present invention will be described in further detail using various embodiments with reference to the accompanying drawings.

First Embodiment

Figure 1:
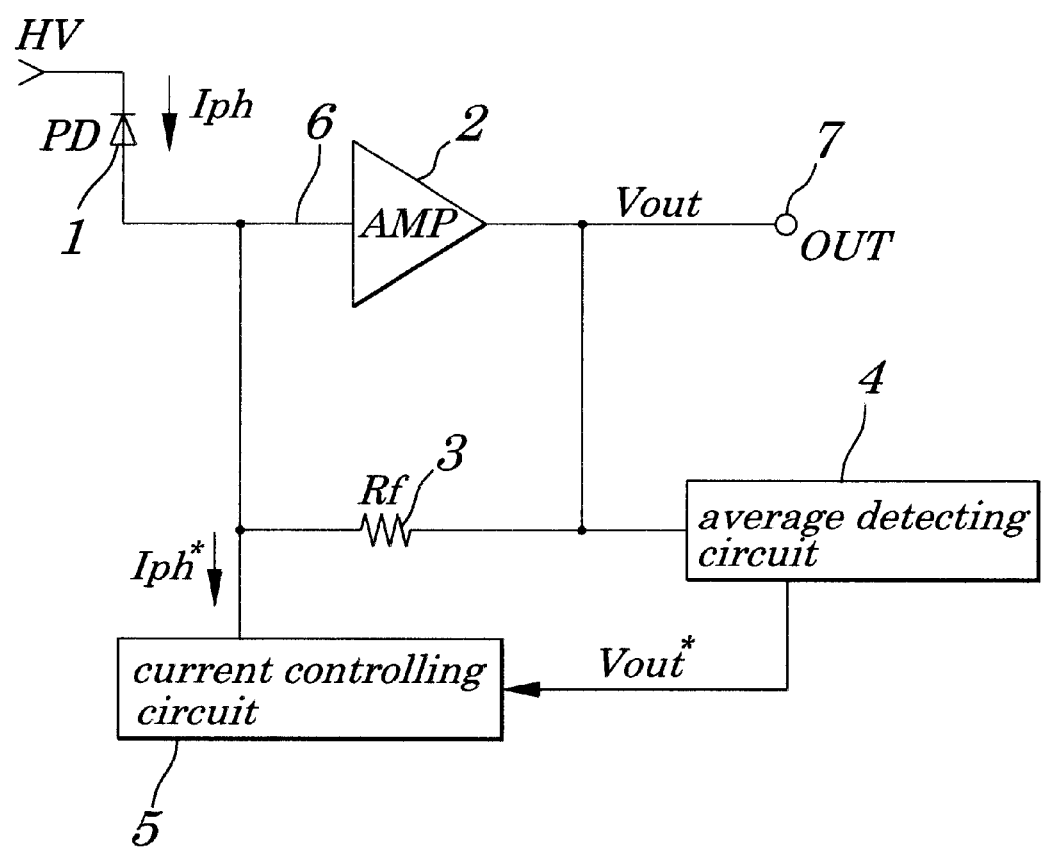
FIG. 1 is a block diagram showing a configuration of a preamplifier according to a first embodiment of the present invention.
Figure 2A:
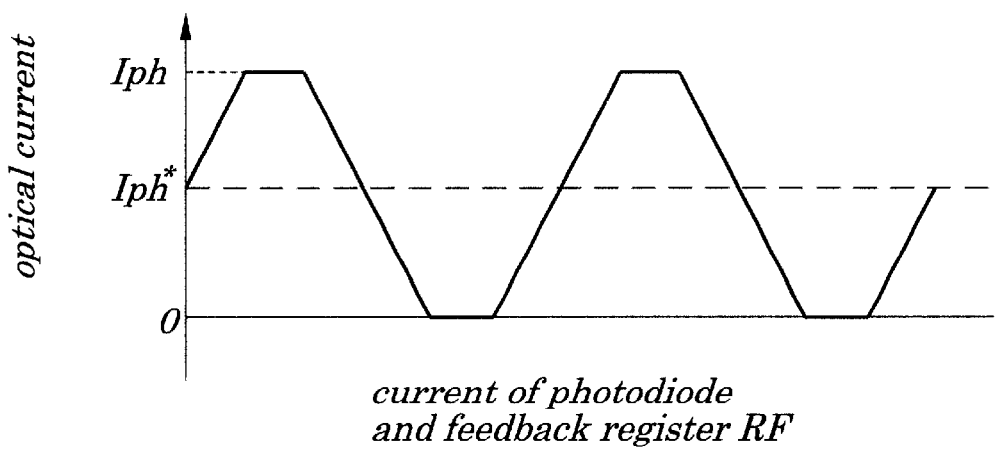
FIG. 2A is a graph showing a current flowing through a feedback resistor.
Figure 2B:
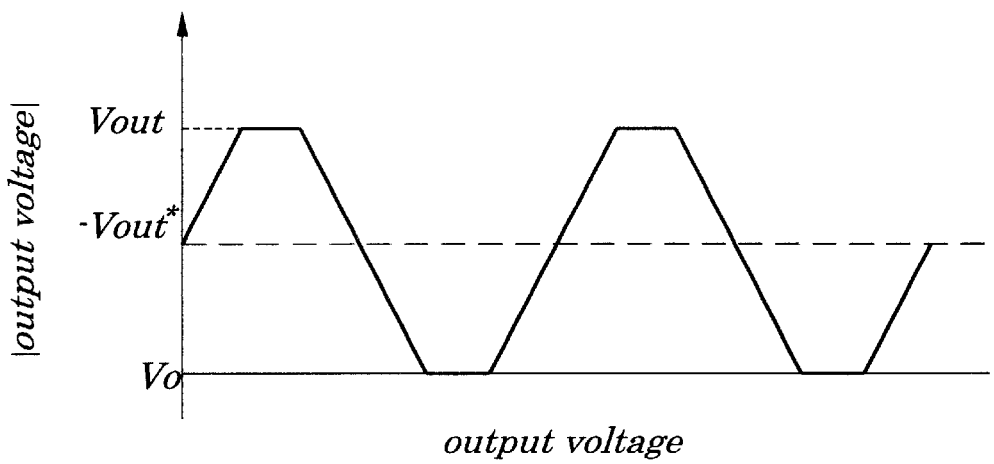
FIG. 2B is a graph showing an output voltage in a case of no current controlling circuit in the preamplifier according to the first embodiment of the present invention.
Figure 3A:
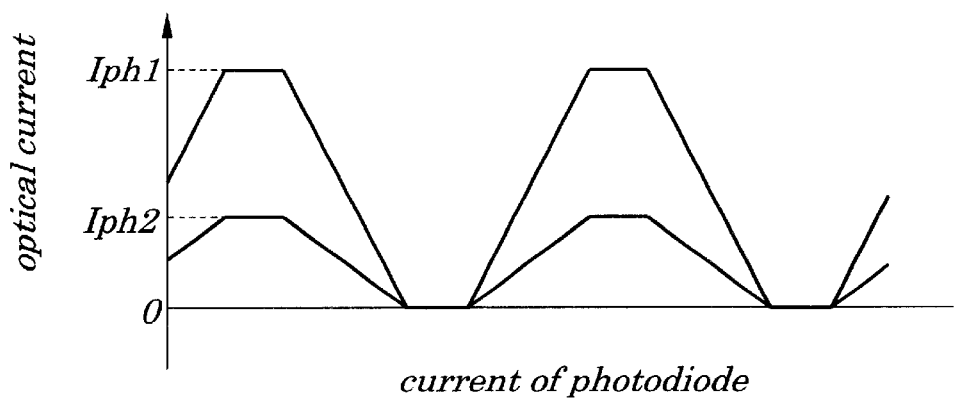
FIG. 3A is a graph showing an optical current varying in accordance with a light receiving level and FIG. 3B is a graph showing an output voltage when the optical current varies as shown in FIG. 3A in the preamplifier according to the first embodiment of the present invention.
Figure 3B:
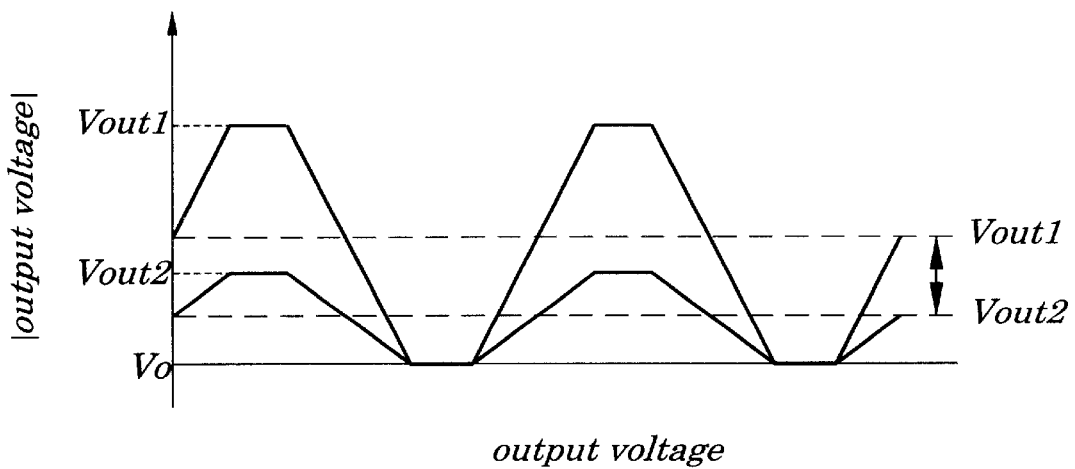
Figure 4A:
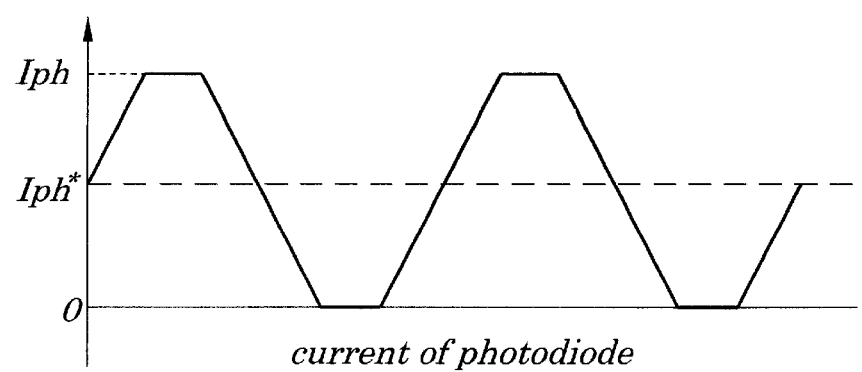
FIG. 4A is a graph showing a current of a photodiode.
Figure 4B:
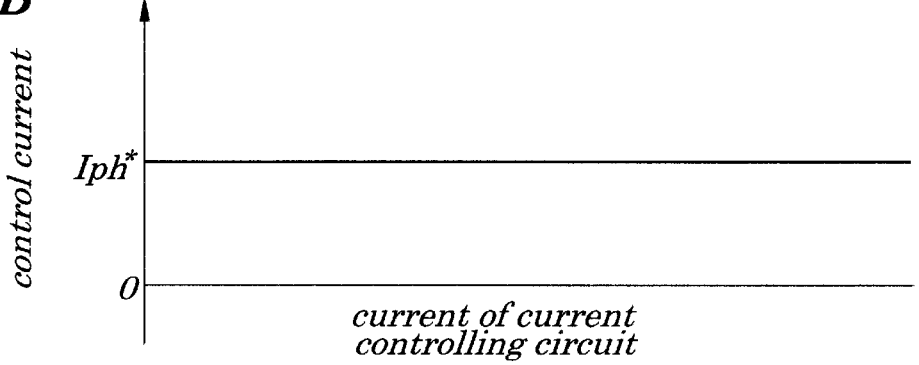
FIG. 4B is a view showing a current of a current controlling circuit.
Figure 4C:
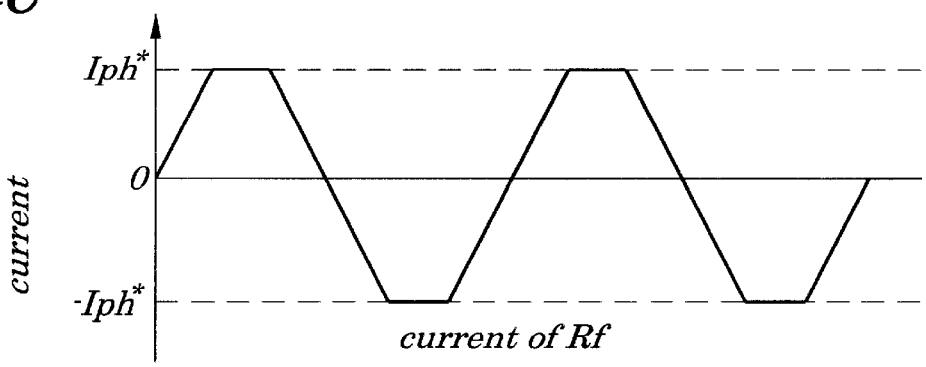
FIG. 4C is a graph showing a current of a feedback resistor Rf.
Figure 4D:
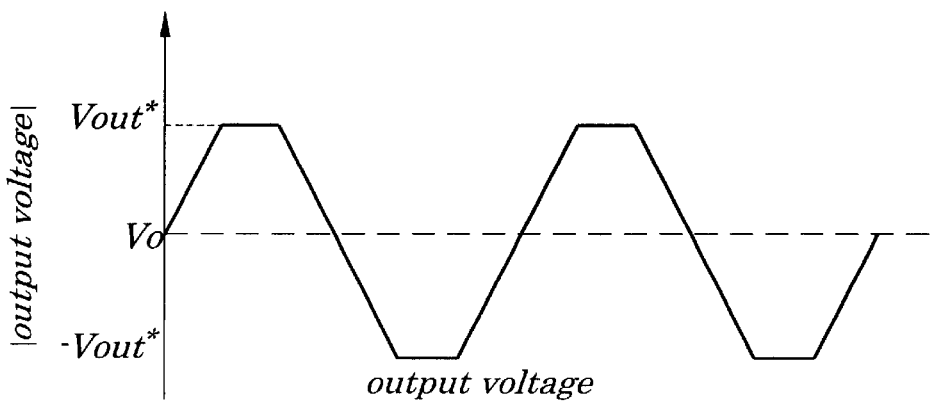
FIG. 4D is a graph showing the output voltage when an average current of the optical current is subtracted by a current controlling circuit in the preamplifier according to the first embodiment of the present invention.
Figure 5A:
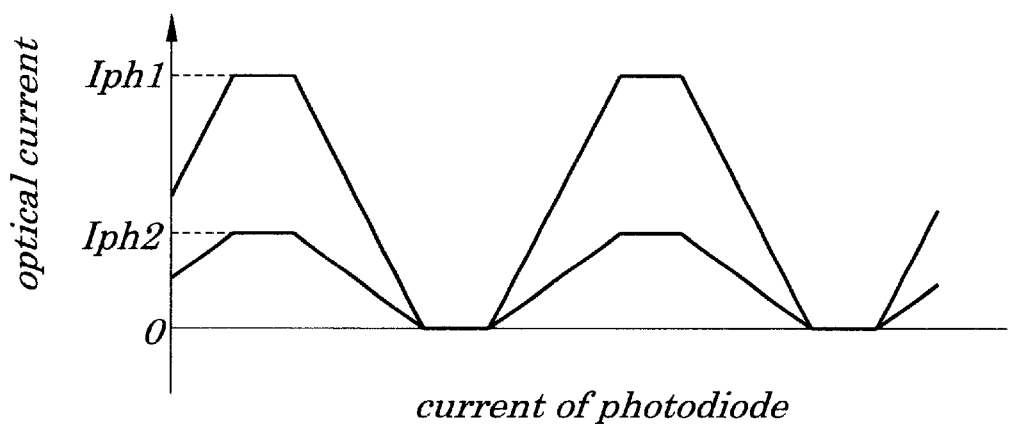
FIG. 5A is a graph showing the optical current varying in accordance with the light receiving level and FIG. 5B is a graph showing the output voltage when the optical current varies as shown in FIG. 5A in the preamplifier according to the first embodiment of the present invention.
Figure 5B:
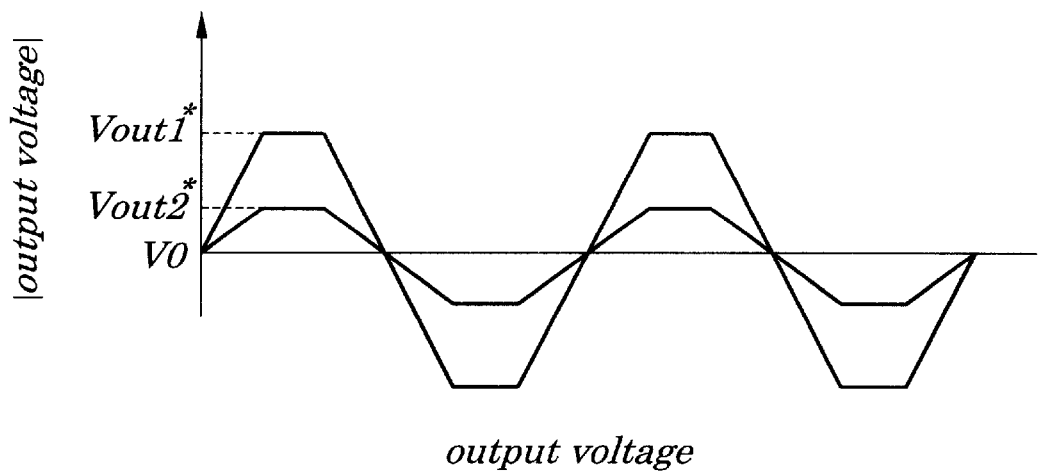
Figure 6:
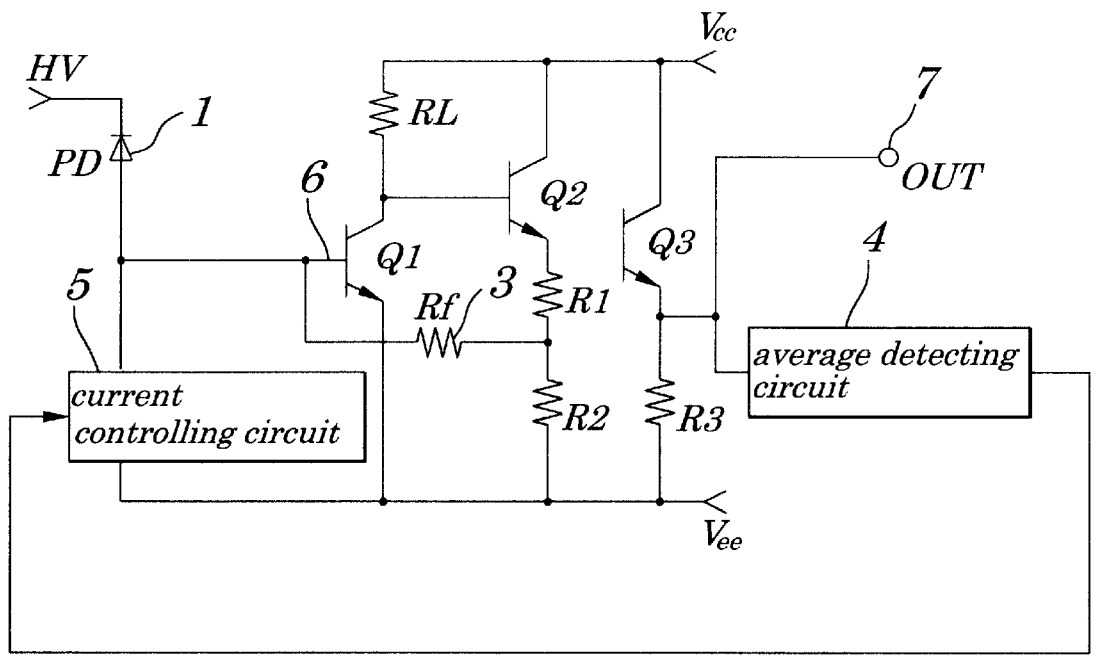
FIG. 6 is a block diagram showing a concrete configuration of the preamplifier according to the first embodiment of the present invention.

FIG. 1 is a block diagram showing a configuration of a preamplifier according to a first embodiment of the present invention, FIG. 2A is a graph showing a current flowing through a feedback resistor and FIG. 2B is a graph showing an output voltage in a case of no current controlling circuit in the preamplifier, FIG. 3A is a graph showing an optical current varying in accordance with a light receiving level and FIG. 3B is a graph showing an output voltage when the optical current varies as shown in FIG. 3A in the preamplifier, FIG. 4A is a graph showing a current of a photodiode, FIG. 4B is a graph showing a current of a current controlling circuit, FIG. 4C is a graph showing a current of a feedback resistor $R_f$ and FIG. 4D is a graph showing an output voltage when an average current of the optical current is subtracted by a current controlling circuit in the preamplifier, FIG. 5A is a graph showing an optical current varying in accordance with a light receiving level and FIG. 5B is a graph showing an output voltage when the optical current varies as shown in FIG. 5A in the preamplifier, and FIG. 6 is a block diagram showing a concrete configuration of the preamplifier according to the first embodiment.

The preamplifier of the first embodiment, as shown in FIG. 1, is mainly provided with a photodiode (PD) 1, an amplifier (AMP) 2, a feedback resistor ($R_f$) 3, an average detecting circuit 4 and a current control circuit 5.

The photodiode 1 makes an optical current flow in accordance with an input light. The amplifier 2 generates an output voltage from an input optical current. The feedback resistor 3 feeds back a current to an input via the output voltage. The average detecting circuit 4 detects an average of the output voltage. The voltage controlling circuit 5 distributes the optical current output from the photodiode 1 in accordance with the output voltage detected by the average detecting circuit 4.

Next, explanations will be given of an operation of the preamplifier of the first embodiment.

The preamplifier of the first embodiment is provided with a current feedback circuit including the amplifier 2 and the feedback resistor $R_f$3. When the photodiode 1 receives input light, an optical current $I_{ph}$ flows from an electric source HV to an input terminal 6 via the photodiode 1. The amplifier 2 generates an output voltage $V_{out}$ to an output terminal (OUT) 7 in accordance with the input optical current. At the time, the feedback is applied via the feedback resistor $R_f$3, and thereby a constant amplifying gain can be obtained. The average detecting circuit 4 generates an average voltage $V_{out}$* (hereunder, * shows an average) of the output voltage $V_{out}$. The current controlling circuit 5 distributes an average current $I_{ph}$* of the optical current $I_{ph}$ from the input terminal 6 to a ground (not shown), therefore, increment of the output voltage $V_{out}$ is prevented at a some level. As a result, the amplifier 2 is prevented from saturating.

In the preamplifier of the first embodiment, when there is no current controlling circuit, a current flowing through the feedback resistor $R_f$ 3 is shown in FIG. 2A and an |output voltage| (| | denotes an absolute value) is shown in FIG. 2B.

The optical current $I_{ph}$ flows into the feedback resistor 3, a signal converted by the feedback resistor $R_f$ 3 into a voltage is output from the output terminal 7. At the time, the output value $V_{out}$ varies on an assumption that an initial bias $V_0$ in $I_{ph}$=0A is set as a base, therefore, a bias potential of the output terminal 7 displaces by the average voltage $V_{out}$*.

Further, in the preamplifier of the first embodiment, when the optical current varies as shown in FIG. 3A in accordance with a variation of the light receiving level, the output voltage varies as shown in FIG. 3B.

When an optical current $I_{ph1}$ and an optical current $I_{ph2}$ vary as shown in FIG. 3A, a |voltage| $V_{out1}$ and a |voltage| $V_{out2}$ which are amplitudes of output voltages vary as shown in FIG. 3B, therefore, a bias voltage of the output terminal varies always in accordance with an amount of the optical current $I_{ph}$.

Further, in a case in that an average optical current $I_{ph}$* of the optical current $I_{ph}$ is subtracted by the current controlling circuit 5, FIG. 4A shows a current of the photodiode 1, FIG. 4B shows a current of the current controlling circuit 5, FIG. 4C shows a current of the feedback resistor $R_f$3 and FIG. 4D shows the output voltage.

Figure 16:
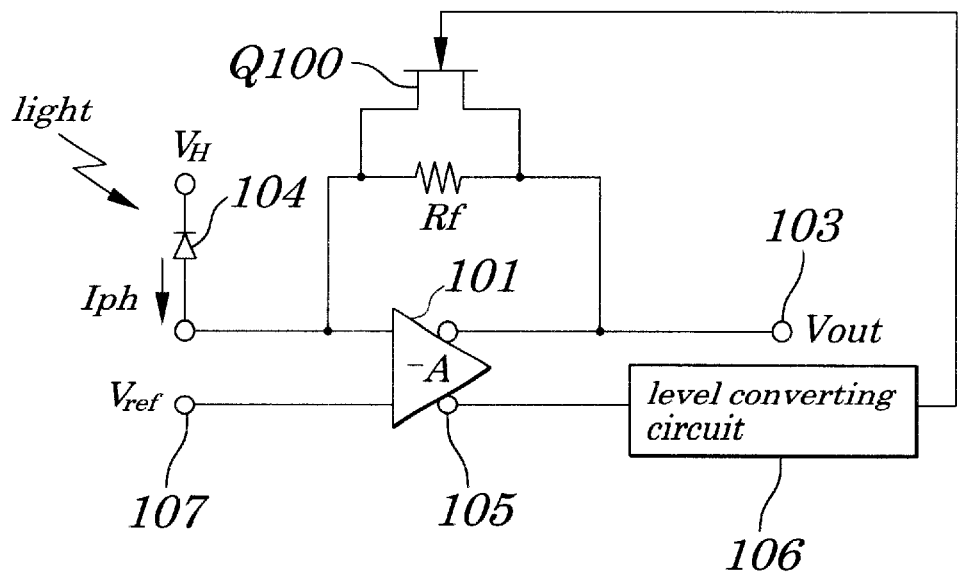
FIG. 16 is a block diagram showing a first conventional preamplifier.
Figure 17:
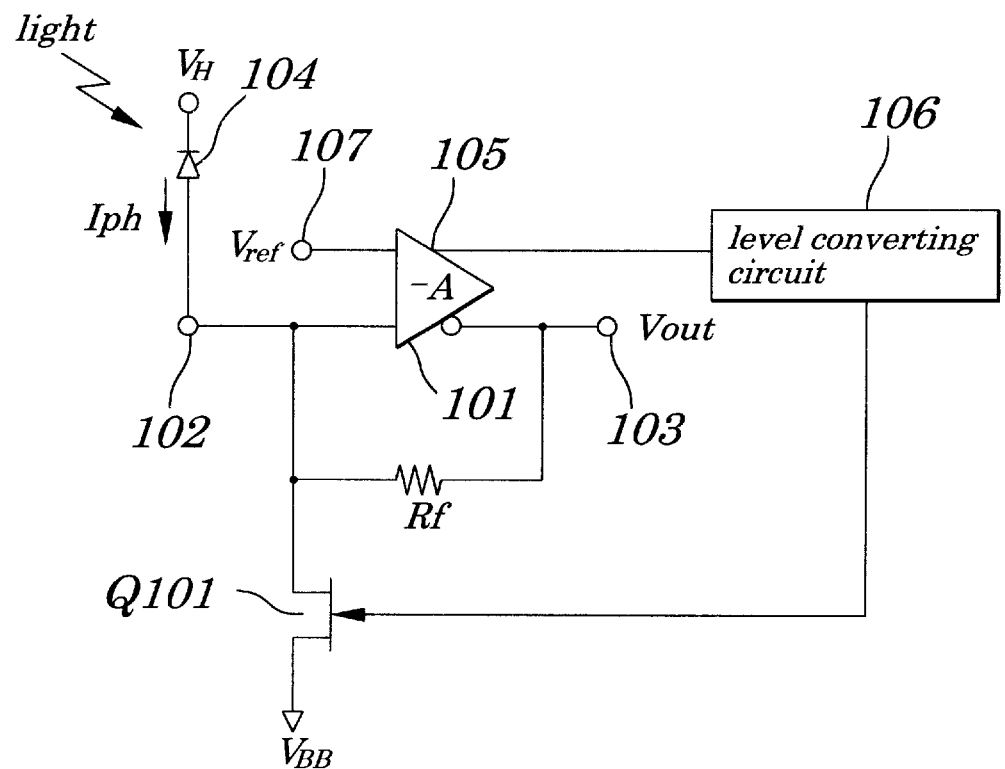
FIG. 17 is a block diagram showing a second conventional preamplifier.
Figure 18:
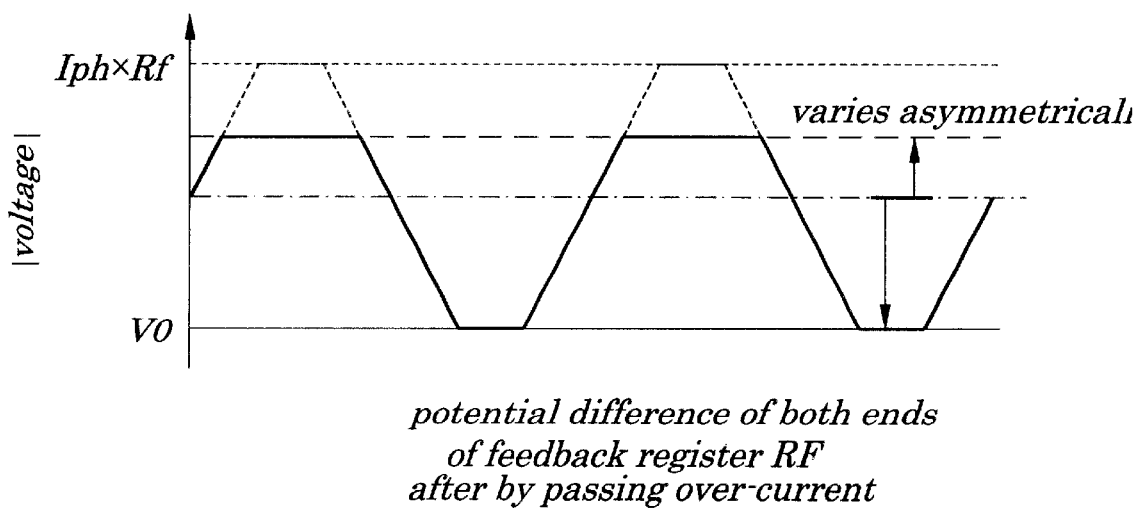
FIG. 18 is a graph showing an example of an output voltage when an input current is bypassed in a conventional preamplifier.

At the time, since the average current $I_{ph}$* of the optical current $I_{ph}$ sent from the photodiode 1 is subtracted, an average of a current flowing into the feedback resistor $R_f$ 3 becomes 0A. Therefore, an amplitude variation of the output voltage for current flowing becomes a half of those of the conventional preamplifiers shown in FIG. 16 and FIG. 17.

As above described, in the preamplifier of the first embodiment, since the average current is distributed, it is possible to available to an operation for a twice optical current of that of the conventional preamplifier when a current of the amplifier 2 is completely similar to a current of the feedback resistor $R_f$ 3. Further, the average potential of the output voltage is equal to the initial bias potential, and a value of the average potential becomes $V_0$.

In the preamplifier of the first embodiment, the optical current $I_{ph}$ of the photodiode PD 1 varies as shown in FIG. 5A, the output voltage varies as shown in FIG. 5B.

As above described, as the optical current $I_{ph}$ varies as the optical current $I_{ph1}$ and the optical current $I_{ph2}$ output voltage amplitudes vary as designated by $V_{out1}$ and $V_{out2}$. However, the bias voltage of the output terminal becomes a constant value $V_0$ at all time.

Hereunder, explanations will be given of a concrete configuration of the preamplifier of the first embodiment.

FIG. 6 shows an example in which a current feedback circuit is configured using a grounded-emitter current feedback trans-impedance circuit in the preamplifier of the first embodiment.

In the preamplifier shown in FIG. 6, an output from a load resistor RL of a transistor Q1 is connected to a base of a transistor Q2 and an output obtained by dividing an output of the transistor Q2 by an emitter resistor R1 and by an emitter resistor R2 is fed back to a base of the transistor Q1 via the feedback resistor $R_f$ 3. With this configuration, a grounded-emitter current feedback trans-impedance circuit is configured. An output optical current of the photodiode (PD) 1 is connected to a base of the transistor Q1, an output from an emitter of the transistor Q2 is obtained from the output terminal (OUT) 7 via an emitter follower circuit including a transistor Q3 and a resistor R3, an average voltage is obtained from the output of the transistor Q2 via an average detecting circuit 4 and is input into the current controlling circuit 5 and an average optical current $I_{ph}^*$ is distributed to a source Vee. With this configuration, the preamplifier shown in FIG. 1 is carried out.

As above described, according to the preamplifier of the first embodiment, the average detecting circuit 4 and the current controlling circuit 5 are provided and an average optical current $I_{ph}^*$ of an input optical current $I_{ph}$ is distributed, therefore, a current flowing into the feedback resistor $R_f$ 3 becomes one-half. As a result, there is no case in that an output voltage $V_{out}$ becomes asymmetrical as far as an input optical current becomes twice compared with a case in that a current is not subtracted, therefore, a normal operation can be carried out.

Further, the bias potential of the output voltage $V_{out}$ is constant regardless of an existence of an input signal, therefore, there is an advantage in that a bias design of a circuit at a rear step becomes easy.

Second Embodiment

Figure 7:
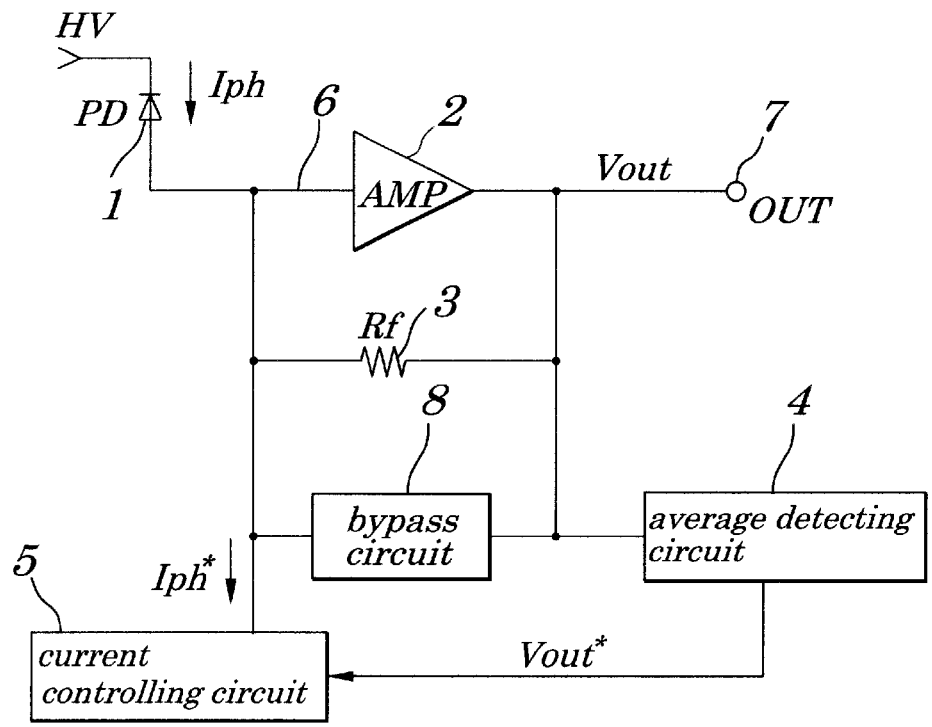
FIG. 7 is a block diagram showing a configuration of a preamplifier according to a second embodiment of the present invention.
Figure 8:
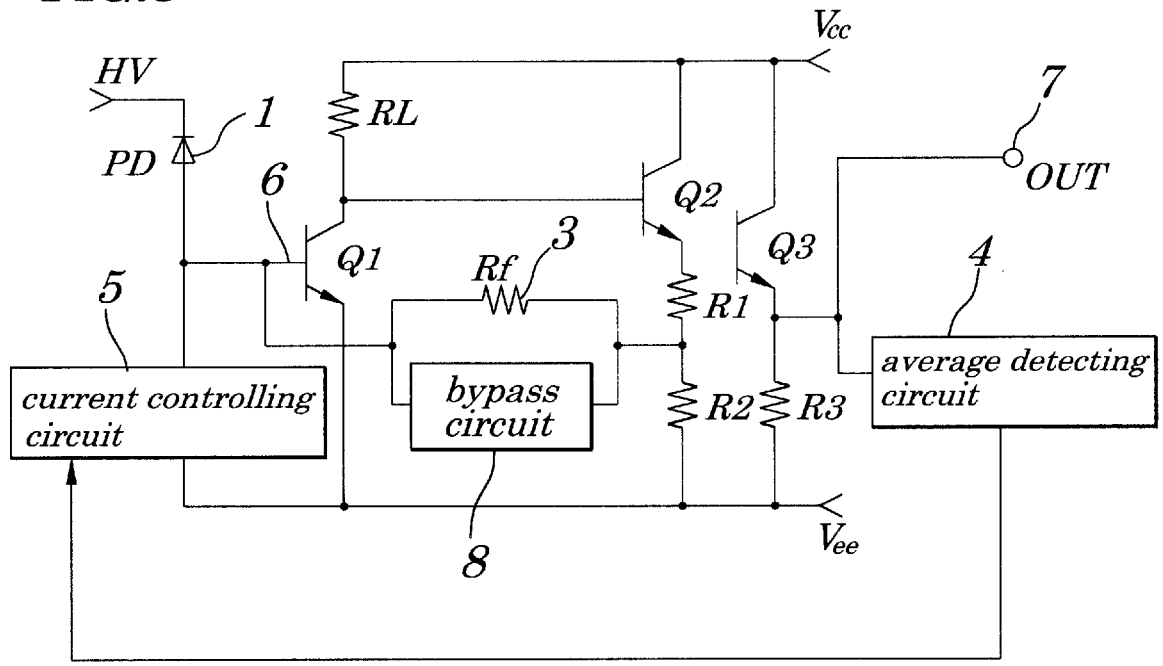
FIG. 8 is a block diagram showing a first concrete configuration of the preamplifier according to the second embodiment of the present invention.
Figure 9:
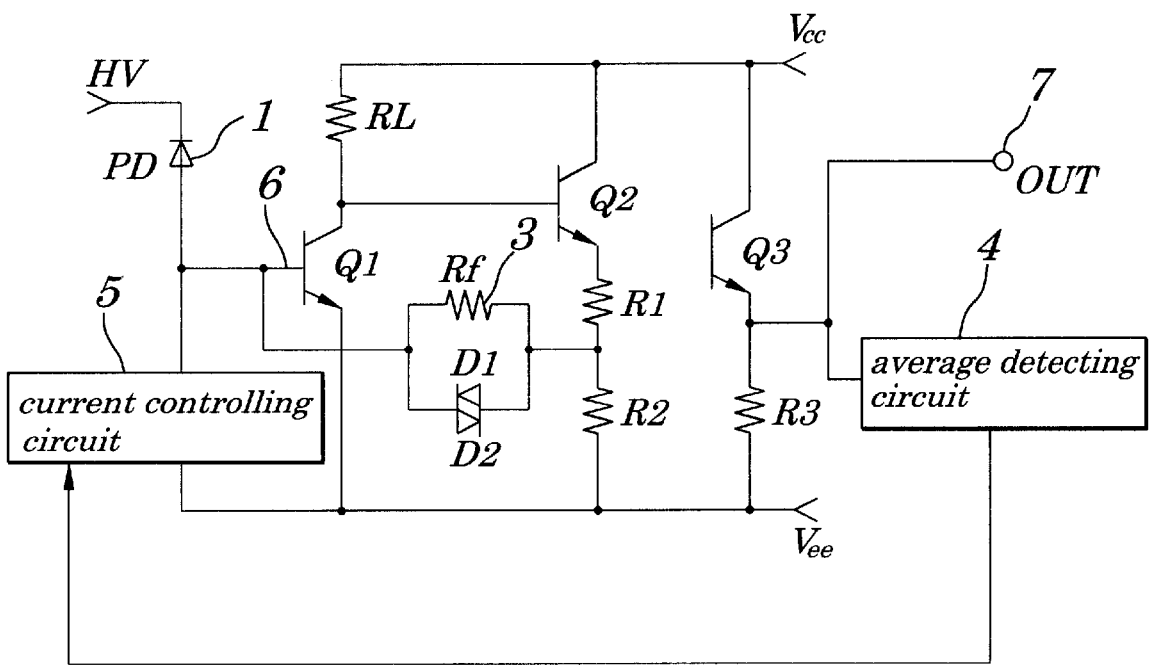
FIG. 9 is a block diagram showing a second concrete configuration of the preamplifier according to the second embodiment of the present invention.
Figure 10:
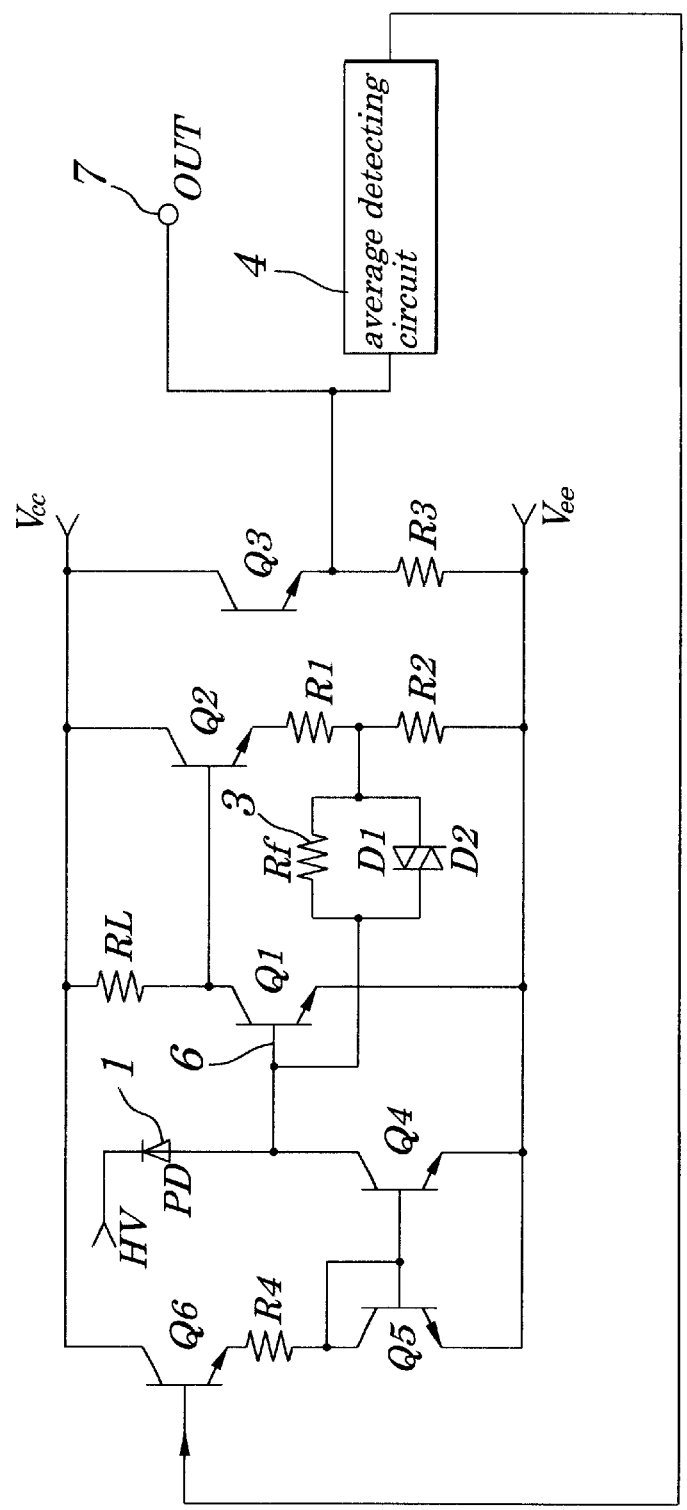
FIG. 10 is a view showing a third concrete configuration of the preamplifier according to the second embodiment of the present invention.
Figure 11A:
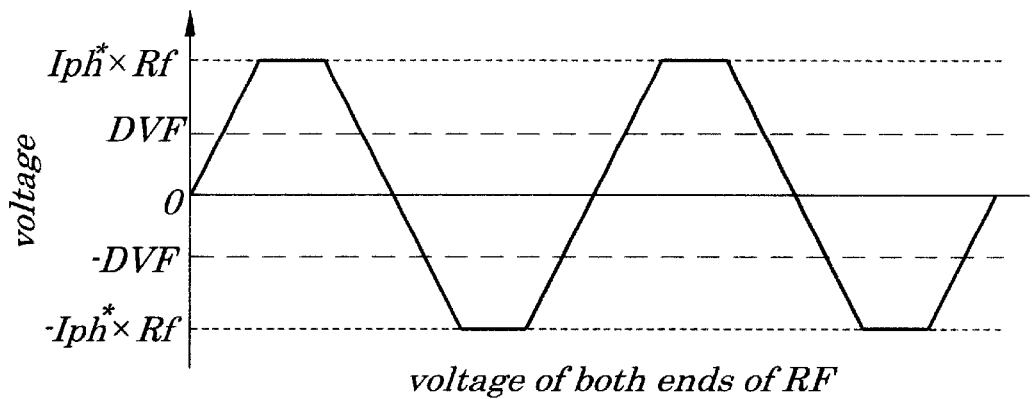
FIG. 11A is a graph explaining an output voltage in the preamplifier.
Figure 11B:
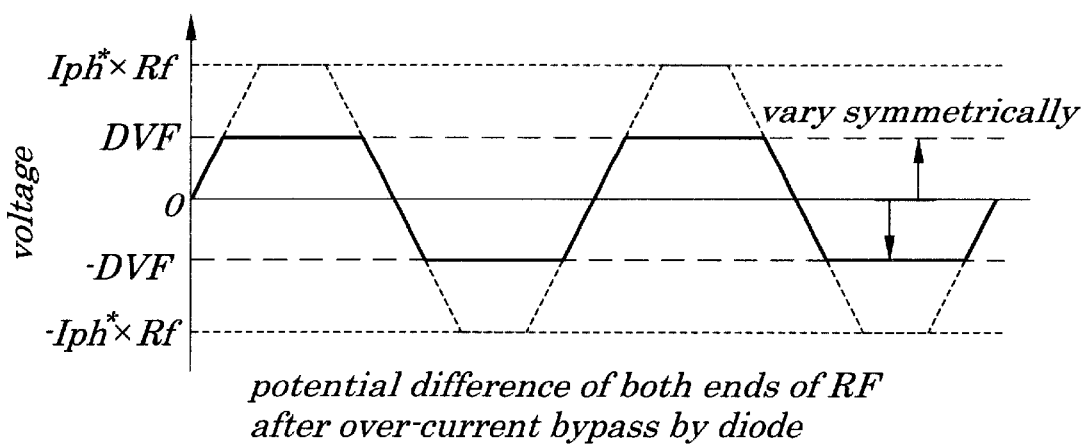
FIG. 11B is a graph explaining an output voltage in the preamplifier according to the second embodiment of the present invention.

FIG. 7 is a block diagram showing a configuration of a preamplifier according to a second embodiment of the present invention, FIG. 8, FIG. 9 and FIG. 10 are views showing concrete configurations of the preamplifier according to the second embodiment, FIG. 11A and FIG. 11B are graphs explaining an output voltage in the preamplifier.

The preamplifier of the second embodiment, as shown in FIG. 7, is mainly provided with a photodiode (PD) 1, an amplifier (AMP) 2, a feedback resistor ($R_f$) 3, an average detecting circuit 4, a current control circuit 5 and a bypass circuit 8.

In the preamplifier of the second embodiment, the photodiode (PD) 1, the amplifier (AMP) 2, the feedback resistor ($R_f$) 3, the average detecting circuit 4 and the current control circuit 5 are similar to those in the first embodiment shown in FIG. 1, however, the second embodiment differs from the first embodiment on a point that the bypass circuit 8 is provided between both ends of the feedback resistor 3.

The bypass circuit 8 clips the feedback resistor ($R_f$) 3 bi-directionally when a voltage between both ends of the feedback resistor ($R_f$) 3 exceeds a threshold.

Next, explanations will be given of concrete configurations of the preamplifier of the second embodiment with reference to FIG. 8, FIG. 9 and FIG. 10.

In the preamplifier shown in FIG. 8, a current feedback circuit including the amplifier (AMP) 2 (FIG. 7) and the feedback resistor ($R_f$) 3 (FIG. 7), similarly to the concrete configuration example of the first embodiment shown in FIG. 6, is formed as a grounded-emitter trans-impedance, and the bypass circuit 8 is connected in parallel to the feedback resistor ($R_f$) 3. The bypass circuit 8 controls the voltage between both ends of the feedback resistor ($R_f$) 3 to a constant threshold voltage.

In the preamplifier shown in FIG. 9, a diode D1 and a diode D2 connected inversely to each other in parallel are used as the bypass circuit 8 in the concrete configuration example in FIG. 8. In this preamplifier, a threshold voltage of the bypass circuit 8 is determined in accordance with forward voltages of the diode D1 and the diode D2.

In the preamplifier shown in FIG. 10, a current mirror circuit including a transistor Q4, a transistor Q5 and a transistor Q6 is used as the current control circuit 5 in the concrete configuration example in FIG. 9. In this preamplifier, with an output from the average detecting circuit 4, a current flows into the transistor Q5 via the transistor Q6 and a resistor R4 and then a current obtained by multiplying a multiple determined by a ratio of the transistor Q5 and the transistor Q4 by a current of the transistor Q5. With this operation, an average optical current $I_{ph}^*$ is distributed from the optical current $I_{ph}$.

Next, explanations will be given of an operation of the preamplifier of the second embodiment.

The basic operation of the preamplifier of the second embodiment is similar that of the preamplifier of the first embodiment shown in FIG. 1. FIG. 11A shows a voltage between both ends of the feedback resistor ($R_f$) 3 of the first embodiment. As above described, though the voltage is limited to $I_{ph}^* \times Rf$ and $-I_{ph}^* \times Rf$ symmetrically up and down, a voltage value increases as light input increases. In accordance with this increment, the output voltage of the amplifier becomes large, therefore, there is a case in that an operating point with another circuit becomes unbalanced and operation becomes unstable.

However, in the preamplifier of the second embodiment, the bypass circuit 8 is connected in parallel with the feedback resistor ($R_f$) 3, therefore, when the $I_{ph}^* \times Rf$ or the $-I_{ph}^* \times Rf$ which is the voltage between both ends of the feedback resistor ($R_f$) 3 exceeds a threshold, these are clipped bi-directionally.

FIG. 11B shows a voltage between both ends of the feedback resistor ($R_f$) 3 of the second embodiment. When the voltage exceeds a threshold voltage DVF or a threshold voltage $-$DVF determined by the bypass circuit 8, a current is distributed to the bypass circuit 8, therefore, the voltage between both ends of the feedback resistor ($R_f$) 3 is clipped at DVF and $-$DVF symmetrically up and down.

With this operation, the output voltage of the preamplifier is limited to a fixed value determined by the threshold voltage DVF and the threshold voltage $-$DVF. Therefore, in the second embodiment, there is no case in that the output voltage of the amplifier increases over a limit and it is possible to keep a duty rate of waveforms in clipping, therefore, there is no case in that an operation of a circuit at a rear step becomes unstable.

As above described, according to the preamplifier of the second embodiment, the bypass circuit 8 is provided in parallel to the feedback resistor ($R_f$) 3 and the voltage between both ends of the feedback resistor ($R_f$) 3 is clipped by a predetermined threshold bi-directionally, therefore, though there is a large input, it is possible to limit the output voltage of the preamplifier to a fixed voltage in accordance with a threshold of the bypass circuit symmetrically up and down without a waveform distortion.

Third Embodiment

Figure 12:
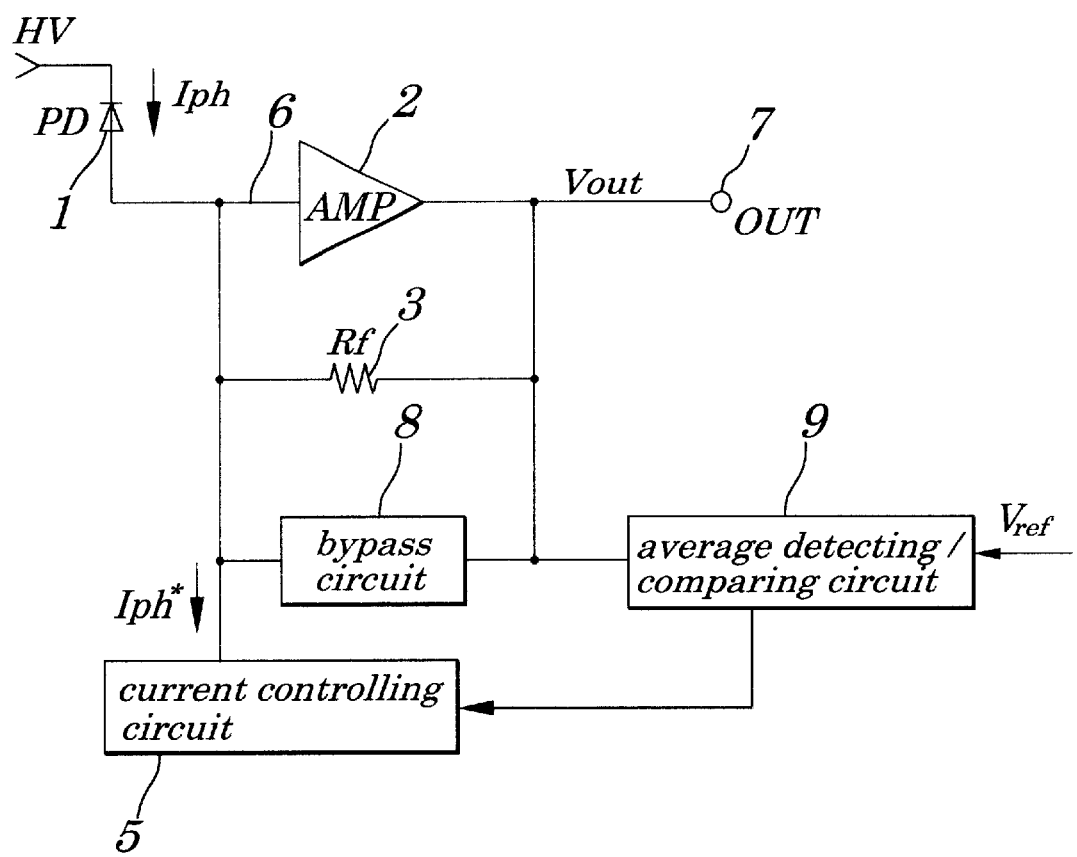
FIG. 12 is a block diagram showing a configuration of a preamplifier according to a third embodiment of the present invention.
Figure 13:
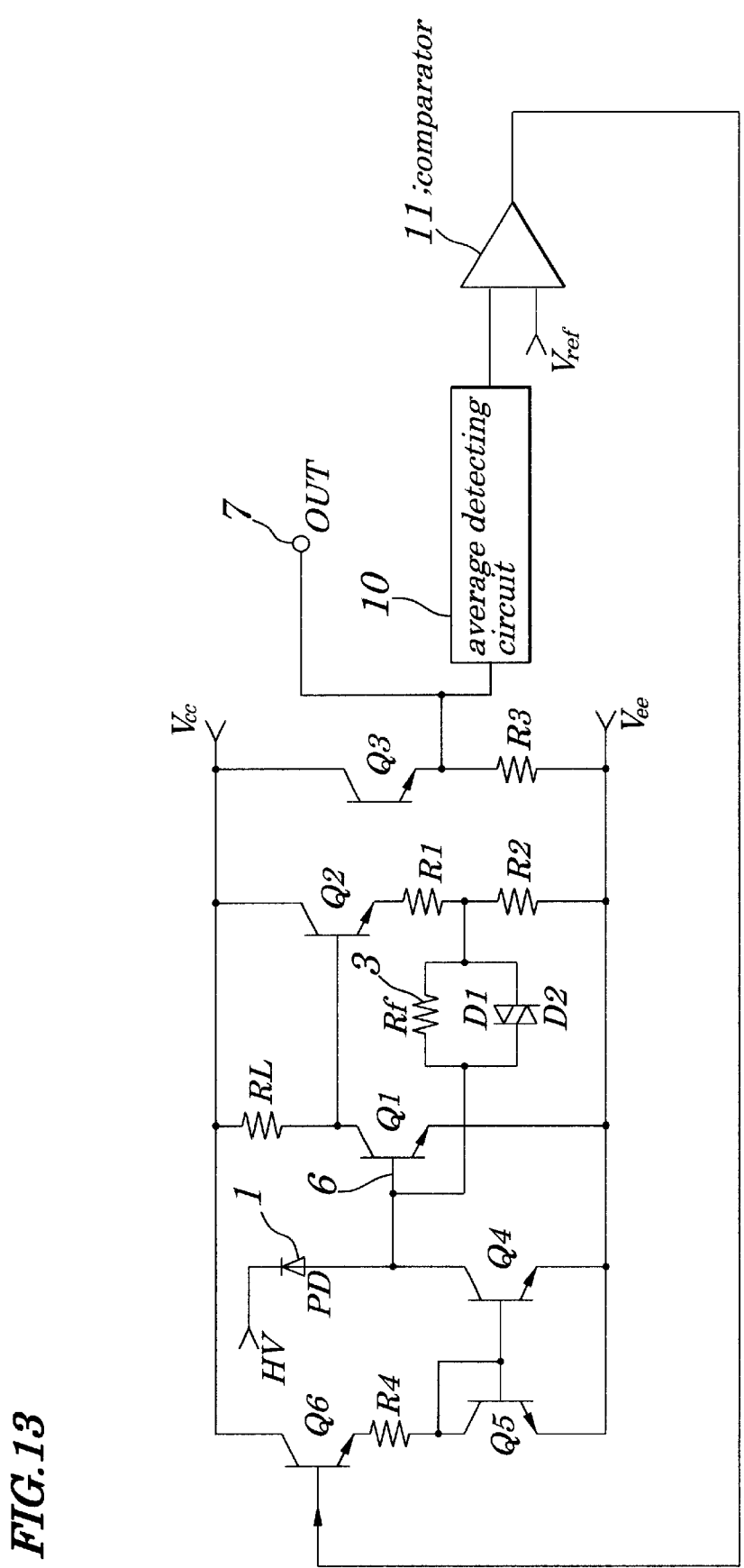
FIG. 13 is a block diagram showing a first concrete configuration of the preamplifier according to the third embodiment of the present invention.
Figure 14:
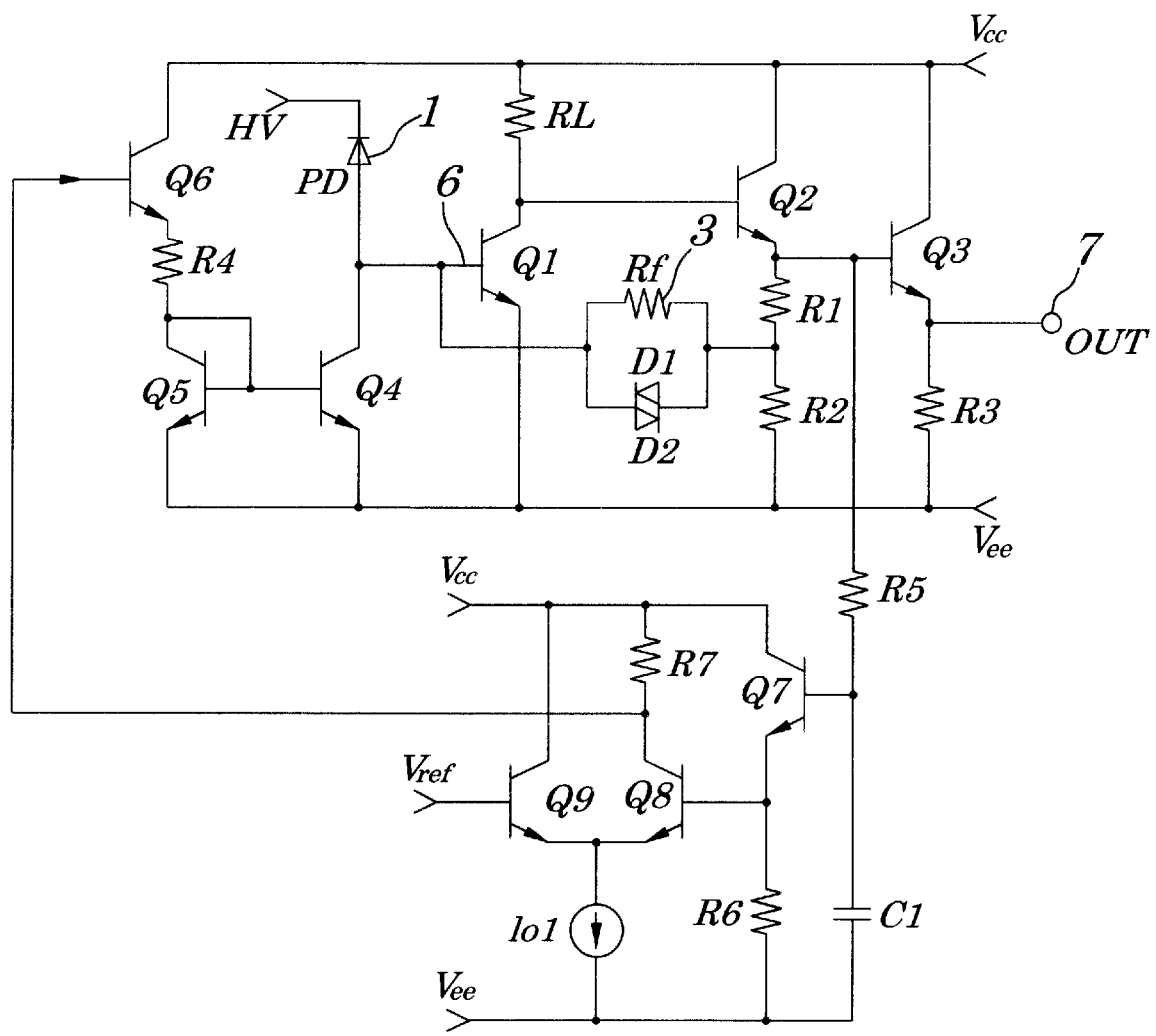
FIG. 14 is a block diagram showing a second concrete configuration of the preamplifier according to the third embodiment of the present invention.

FIG. 12 is a block diagram showing a configuration of a preamplifier according to a third embodiment of the present invention, FIG. 13 and FIG. 14 are block diagrams showing concrete configurations of the preamplifier according to the third embodiment.

The preamplifier of the third embodiment, as shown in FIG. 12, is mainly provided with a photodiode (PD) 1, an amplifier (AMP) 2, a feedback resistor ($R_f$) 3, a current controlling circuit 5, a bypass circuit 8 and an average detecting/comparing circuit 9.

In the preamplifier of the third embodiment, the photodiode (PD) 1, the amplifier (AMP) 2, the feedback resistor ($R_f$) 3, the current controlling circuit 5 and the bypass circuit 8 are similar to those in the second embodiment shown in FIG. 7, however, the third embodiment differs from the second embodiment on a point that the average detecting/comparing circuit 9 is provided instead of an average detecting circuit 4.

The average detecting/comparing circuit 9 detects an average output voltage of the amplifier 2 and, when the average output voltage exceeds a reference voltage $V_{ref}$, generates an output in order to operate the current controlling circuit 5.

Next, explanations will be given of concrete configurations of the preamplifier of the third embodiment with reference to FIG. 13 and FIG. 14.

In the preamplifier shown in FIG. 13, an average detecting circuit 10 and a comparator 11 are provided as the average detecting/comparing circuit 9 (FIG. 12) instead of the average detecting circuit 4 in the preamplifier of the second embodiment shown in FIG. 10.

The average detecting circuit 10 detects an average voltage of the output voltage at an output terminal 7. The comparator 11 generates an output when the average voltage from the average detecting circuit 10 exceeds the reference voltage $V_{ref}$.

In the preamplifier shown in FIG. 14, an integrating circuit including a resistor R5 and a capacitor C1 and an emitter follower circuit including a transistor Q7 and a resistor R6 are provided as the average detecting circuit 10 in the preamplifier shown in FIG. 13 and a differential amplifier including a transistor Q8 (FIG. 14) and a transistor Q9 (FIG. 14) is provided as the comparator 11 in FIG. 13.

Next, explanations will be given of an operation of the preamplifier of the third embodiment with reference to FIG. 14.

In FIG. 14, an operation of the preamplifier of the third embodiment except for elements corresponding to the average detecting circuit 10 and the comparator 11 is similar to that of the preamplifier of the second embodiment shown in FIG. 10.

An output voltage at an emitter of a transistor Q2 is smoothed in the integrating circuit including a resistor R5 and a capacitor C1 and an average voltage is output via the emitter follower circuit including a transistor Q7 and a resistor R6. The differential amplifier including a transistor Q8 and a transistor Q9 compares the average voltage with the reference voltage $V_{ref}$ and outputs an excessive voltage from the reference voltage $V_{ref}$. The current mirror circuit including a transistor Q4, a transistor Q5 and a transistor Q6 distributes an average current of the optical current in accordance with the average voltage.

As above described, the preamplifier of the third embodiment is provided with the average detecting/comparing circuit 9 (FIG. 12) and distributes the average current of the optical current in accordance with the average voltage exceeding the reference voltage, therefore, it is possible to not distribute the average current when no light is input. As a result, it is possible to not vary the output voltage when no light is input and it is possible to set a limit value for the output voltage of the preamplifier accurately.

Fourth Embodiment

Figure 15:
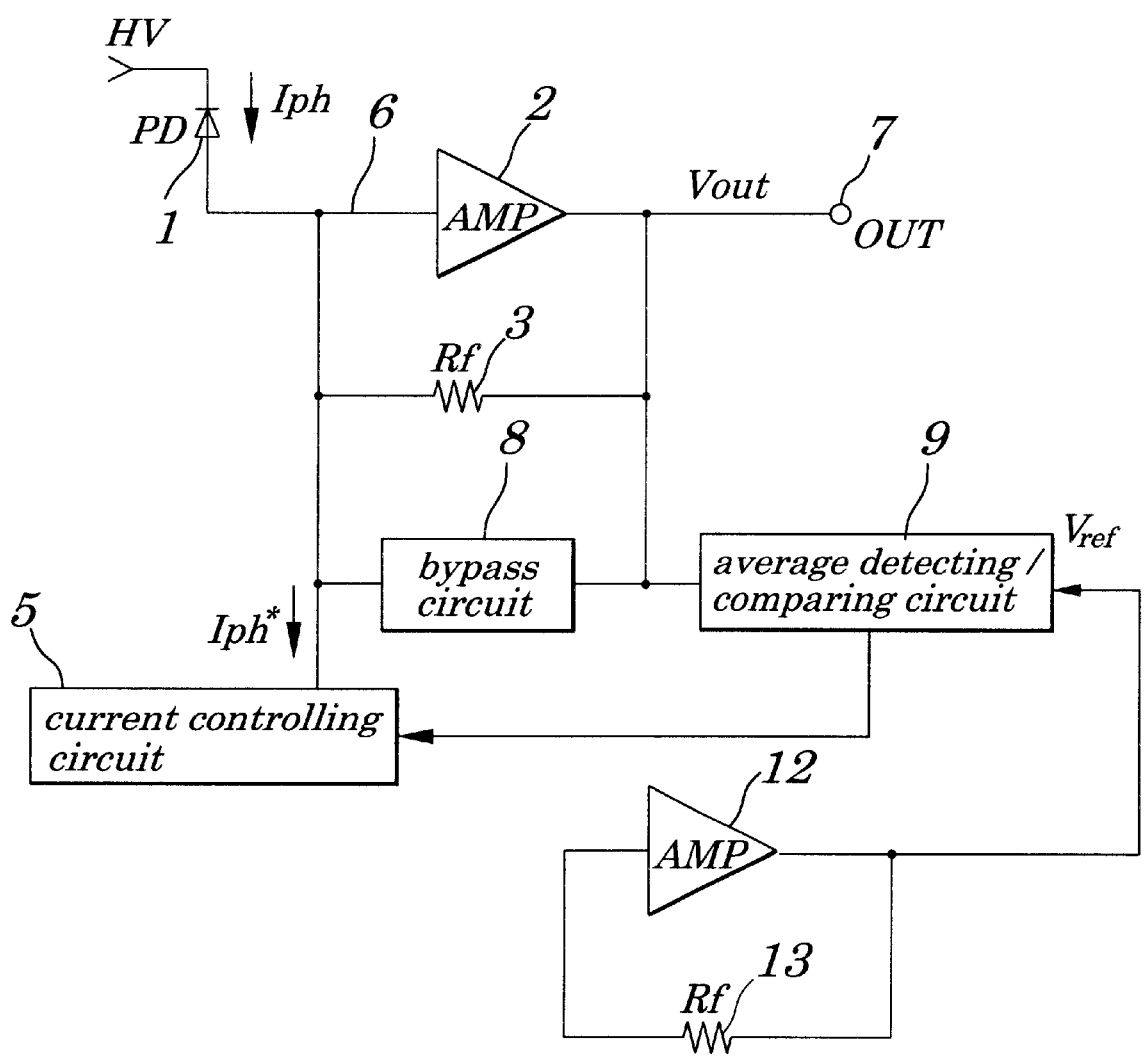
FIG. 15 is a block diagram showing a configuration of a preamplifier according to a fourth embodiment of the present invention.

FIG. 15 is a block diagram showing a configuration of a preamplifier according to a fourth embodiment of the present invention.

The preamplifier of the fourth embodiment, as shown in FIG. 15, is mainly provided with a photodiode (PD) 1, an amplifier (AMP) 2, a feedback resistor ($R_f$) 3, a current controlling circuit 5, a bypass circuit 8, an average detecting/comparing circuit 9, an amplifier (AMP) 12 and a feedback resistor ($R_f$) 13.

In the preamplifier of the fourth embodiment, the photodiode (PD) 1, the amplifier (AMP) 2, the feedback resistor ($R_f$) 3, the current controlling circuit 5, the bypass circuit 8 and the average detecting/comparing circuit 9 are similar to those in the third embodiment shown in FIG. 12, however, the fourth embodiment differs from the third embodiment on a point that a circuit including the amplifier 12 and the feedback resistor 13 is provided as a source of a reference voltage $V_{ref}$.

The amplifier 12 generates the reference voltage $V_{ref}$ as an output voltage of an input current via the feedback resistor 13. The feedback resistor 13 feeds back a current to an input of the amplifier 12 via the output voltage from the amplifier 12.

Next, explanations will be given of an operation of the preamplifier of the fourth embodiment with reference to FIG. 15.

In FIG. 15, an operation of circuits except the amplifier 12 and the feedback resistor 13 is similar to that of the third embodiment shown in FIG. 12.

The amplifier 12, by feeding back an output of the amplifier 12 to an input thereof via the feedback resistor 13, generates an output in a case that there is no input except a feedback input as the reference voltage $V_{ref}$. When configurations of the amplifier 12 and the feedback resistor 13 are similar to those of the amplifier 2 and the feedback resistor 3, the reference voltage $V_{ref}$ becomes equal to an output average of the amplifier 2 when no light is input.

Therefore, in the preamplifier shown in FIG. 15, when no light is input, an output voltage from the average detecting/comparing circuit 9 is 0 (zero) and an optical current average $I_{ph}*$ distributed by the current controlling circuit 5 also becomes 0 (zero).

As above described, the preamplifier of the fourth embodiment is provided with a reference voltage $V_{ref}$ generating circuit of which a configuration is similar to the amplifier 2 and the feedback resistor 3, therefore, it is possible to supply stably the reference voltage $V_{ref}$ setting a current distributed to the current controlling circuit 5 to 0 (zero) when no light is input. As a result, it is possible to set a limit value of the output voltage from the preamplifier accurately.

It is apparent that the present invention is not limited to the above embodiments but may be changed and modified without departing from the scope and spirit of the invention.

For example, a current mirror circuit is used as a current controlling circuit in the second embodiment and in the third embodiment, however, these are also available to other embodiments. Also, an integrating circuit and an emitter follower circuit are used as an average detecting circuit in the third embodiment, however, this is also available to other embodiments. Also, an average detecting/comparing circuit may be used instead of the average detecting circuit in the first embodiment. Furthermore, as an input of the average detecting circuit 4 or an average detecting/comparing circuit 9, an input or an output of an emitter follower including an transistor Q3 and an resistor R3 is used.

What is claimed is:

1. A preamplifier comprising:
   a bi-directional bypass circuit comprising at least two diodes connected inversely to each other in parallel;

a current feedback circuit including an amplifier for amplifying an input optical current and a feedback resistor connected between an input and an output of said amplifier, said feedback resistor being connected in parallel to said bypass circuit;

an average detecting circuit for detecting an average of an output voltage of said current feedback circuit; and a current controlling circuit for distributing said input optical current in accordance with a detected average of said output voltage.

2. The preamplifier according to claim 1, wherein said current feedback circuit comprises a grounded-emitter transistor amplifier for amplifying said input optical current, an emitter follower transistor amplifier for amplifying an output from said grounded-emitter transistor amplifier and a feedback resistor connecting an output of said emitter follower transistor amplifier with an input of said grounded-emitter transistor amplifier.

3. A preamplifier comprising:

a current feedback circuit including an amplifier for amplifying an input optical current and a feedback resistor connected between an input and an output of said amplifier;

an average detecting circuit for detecting an average of an output voltage of said current feedback circuit; and a current controlling circuit for distributing said input optical current in accordance with a detected average of said output voltage, wherein a bypass circuit for clipping a voltage more than a predetermined threshold bi-directionally is connected in parallel with said feedback resistor of said current feedback circuit.

4. A preamplifier comprising:

a current feedback circuit including an amplifier for amplifying an input optical current and a feedback resistor connected between an input and an output of said amplifier wherein said current feedback circuit comprises a grounded-emitter transistor amplifier for amplifying said input optical current, an emitter follower transistor amplifier for amplifying an output from said grounded-emitter transistor amplifier and a feedback resistor connecting an output of said emitter follower transistor amplifier with an input of said grounded-emitter transistor amplifier;

an average detecting circuit for detecting an average of an output voltage of said current feedback circuit;

a current controlling circuit for distributing said input optical current in accordance with a detected average of said output voltage;

wherein a bypass circuit for clipping a voltage more than a predetermined threshold bi-directionally is connected in parallel with said feedback resistor of said current feedback circuit.

5. The preamplifier according to claim 3, wherein said bypass circuit comprises two diodes connected in parallel in an opposite direction to each other.

6. The preamplifier according to claim 4, wherein said bypass circuit comprises two diodes connected in parallel in an opposite direction to each other.

7. The preamplifier according to claim 1, wherein said current controlling circuit is a current mirror circuit for distributing said input optical current in accordance with said output voltage of said average detecting circuit.

8. A preamplifier comprising:

a current feedback circuit including an amplifier for amplifying an input optical current and a feedback resistor connected between an input and an output of said amplifier;

an average detecting circuit for detecting an average of an output voltage of said current feedback circuit; and a current controlling circuit for distributing said input optical current in accordance with a detected average of said output voltage, wherein said average detecting circuit comprises an integrating circuit for smoothing said output voltage of said current feedback circuit and an emitter follower circuit for amplifying said output voltage smoothed by said integrating circuit.

9. The preamplifier according to claim 1, wherein a comparing circuit is provided at an output of said average detecting circuit and outputs an average voltage exceeding a reference voltage.

10. The preamplifier according to claim 8, wherein a comparing circuit is provided at an output of said average detecting circuit and outputs an average voltage exceeding a reference voltage.

11. The preamplifier according to claim 1, wherein a comparing circuit is provided at an output of said average detecting circuit and outputs an average voltage exceeding a reference voltage which is generated by a non-input current feedback circuit having a same configuration of said current feedback circuit.

12. The preamplifier according to claim 8, wherein a comparing circuit is provided at an output of said average detecting circuit and outputs an average voltage exceeding a reference voltage.

13. The preamplifier of claim 1, wherein said average detecting circuit comprises an integrating circuit for smoothing said output voltage of said current feedback circuit.

14. The preamplifier of claim 1, wherein said average detecting circuit comprises an emitter-follower circuit for amplifying said output voltage smoothed by said integrating circuit.

15. The preamplifier according to claim 1, wherein said average detecting circuit comprises an integrating circuit.

* * * * *